United States Patent [19]

Murdoch

[11] Patent Number: 5,000,225
[45] Date of Patent: Mar. 19, 1991

[54] LOW PROFILE, COMBINATION THROTTLE/GATE VALVE FOR A MULTI-PUMP CHAMBER

[75] Inventor: Steven Murdoch, Palo Alto, Calif.

[73] Assignee: Applied Materials, Inc., Santa Clara, Calif.

[21] Appl. No.: 438,554

[22] Filed: Nov. 17, 1989

[51] Int. Cl.⁵ ............................................. F16K 25/00
[52] U.S. Cl. ............................ 137/625.46; 137/566; 137/887; 251/192; 118/50; 437/228
[58] Field of Search .................... 137/625.18, 625.46, 137/566, 567, 887; 251/208, 192, 188, 187; 118/50; 437/228

[56] References Cited

U.S. PATENT DOCUMENTS

| | | | |
|---|---|---|---|
| 1,142,723 | 6/1915 | Merritt | 251/192 |
| 2,889,852 | 6/1959 | Dunlap | 137/625.46 X |
| 3,131,706 | 5/1964 | Harban | 137/625.46 X |
| 3,414,007 | 12/1968 | DeMarco | 251/208 X |
| 3,488,032 | 1/1970 | Scott | 137/625.48 X |
| 4,089,735 | 5/1978 | Sussmann | 437/228 X |
| 4,516,606 | 5/1985 | Worley | 251/208 X |
| 4,790,920 | 12/1988 | Krzanich | 437/228 X |
| 4,899,685 | 2/1990 | Kawakami | 118/50 X |
| 4,899,686 | 2/1990 | Toshima et al. | 118/50 |

OTHER PUBLICATIONS

"Fishtail vs. Conventional Discs in Butterfly Valves", Carl D. Wilson, Instruments & Control Systems, vol. 41; Mar. 1968.
"The Note on the Reduction of the Fluid Dynamic Torque of Butterfly Valves", D. W. Bryer/D. E. Walshe, National Physical Laboratory; Sep. 1986.

Primary Examiner—John Rivell
Attorney, Agent, or Firm—Douglas L. Weller

[57] ABSTRACT

A combination gate valve and throttle valve is presented for use between a process chamber and at least one pump includes a base plate a lower plate and a gate plate. The base plate is attached to the process chamber and includes a base plate gas port for each pump in the system. Each pump is attached to the lower plate. Where each pump is attached to the lower plate there is a lower plate gas port. Each of the lower plate gas ports lines up with one of the base plate gas ports. The gate plate is attached between the lower plate and the base plate. The gate plate has gate plate gas ports so that when the gate plate is moved into an open position with respect to the base plate and the lower plate, the gate plate gas ports line up with the lower plate gas ports and the base plate gas ports allowing gas to flow from the process chamber through the gas ports to the pumps. When the gate plate is moved into a closed position the process chamber is selaed from the pumps. The process chamber is now isolated from the pumps allowing the pumps to be removed without contaminating the process chamber.

11 Claims, 2 Drawing Sheets

LOW PROFILE, COMBINATION THROTTLE/GATE VALVE FOR A MULTI-PUMP CHAMBER

BACKGROUND

The present invention concerns a combination throttle valve and gate valve to be used in a multi-pump chamber such as is typically used in a system to etch semiconductor wafers.

Typically in a process chamber in which silicon wafers are etched, a high flow pump is used to provide air/gas flow through the process chamber and to maintain low pressure inside the process chamber. Throttling of pumping speed is typically done by use of a butterfly valve between the process chamber and the high flow pump. Additionally a gate valve may be stacked up with the butterfly valve between the process chamber and the high flow pump allowing the high flow pump to be isolated from the process chamber, for example, to provide isolation of the process chamber during removal of the pump.

A single pump, however, may not be able to efficiently supply the greater pumping speed or pumping capacity needed for some processes. Further, when a butterfly valve is in series with a gate valve there is a large gate depth dimension, which makes the process chamber system cumbersome.

SUMMARY OF THE INVENTION

In accordance with the preferred embodiment of the present invention a combination gate valve and throttle valve is presented for use between a process chamber and at least one pump. The combination gate valve and throttle valve includes a base plate a lower plate and a gate plate. The base plate is attached to the process chamber and includes a base plate gas port for each pump in the system. Each pump is attached to the lower plate. Where each pump is attached to the lower plate there is a lower plate gas port. Each of the lower plate gas ports lines up with one of the base plate gas ports. The gate plate is attached between the lower plate and the base plate. The gate plate has gate plate gas ports so that when the gate plate is moved into an open position with respect to the base plate and the lower plate, the gate plate gas ports line up with the lower plate gas ports and the base plate gas ports allowing gas to flow from the process chamber through the gas ports to the pumps. When the gate plate is moved into a closed position the process chamber is sealed from from the pumps.

The gate plate may be rotated with respect to the base plate and the lower plate with the use of cams connected to the lower plate. Vertical ridges may be placed on the gate plate such that when the gate plate is moved to the closed position the gate plate is elevated with respect to the base plate and thus seals gas flow out of the process chamber. Additionally, abutment ridges may be added to the gate plate and cam followers may be attached to the lower plate to limit reciprocal movement of the gate plate with respect to the base plate and the lower plate.

The combination gate valve and throttle valve allows for a significantly reduced gate depth dimension over the prior art. Additionally, the combination gate valve and throttle valve is designed to support a plurality of pumps thereby allowing pumping speed and pumping capacity to be improved over the prior art.

DESCRIPTION OF THE PREFERRED EMBODIMENT

Figure 1:
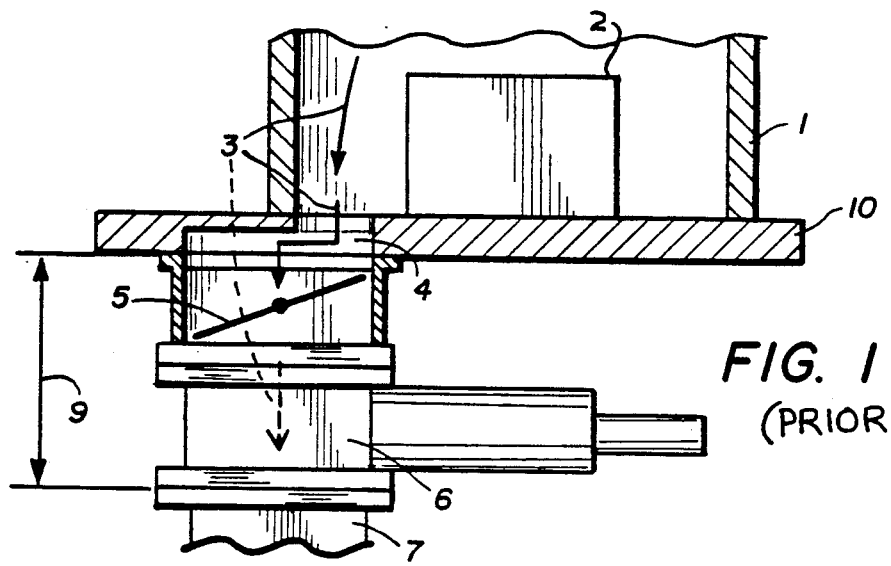
FIG. 1 show a prior art process chamber with a single pump, and with a butterfly valve and gate valve stacked between the process chamber and the single pump.

FIG. 1 shows a prior art process chamber 1. Arrows 3 show gas flow around an anode 2 within process chamber 1, through an opening 4 in a base 10 of process chamber 1, through a butterfly valve 5, through a gate valve 6 and to a pump 7. Butterfly valve 5 is used to vary the rate of gas flow. Gate valve 6 is used to isolate process chamber 1 from pump 7, for example, when pump 7 is being removed for repairs or service. Butterfly valve 5 is stacked with gate valve 6 resulting in a typical gate depth dimension 9 of eight inches. This prior art single pump system is limited in pumping speed and pumping capacity. Also the large gate depth dimension makes the system cumbersome.

Figure 2:
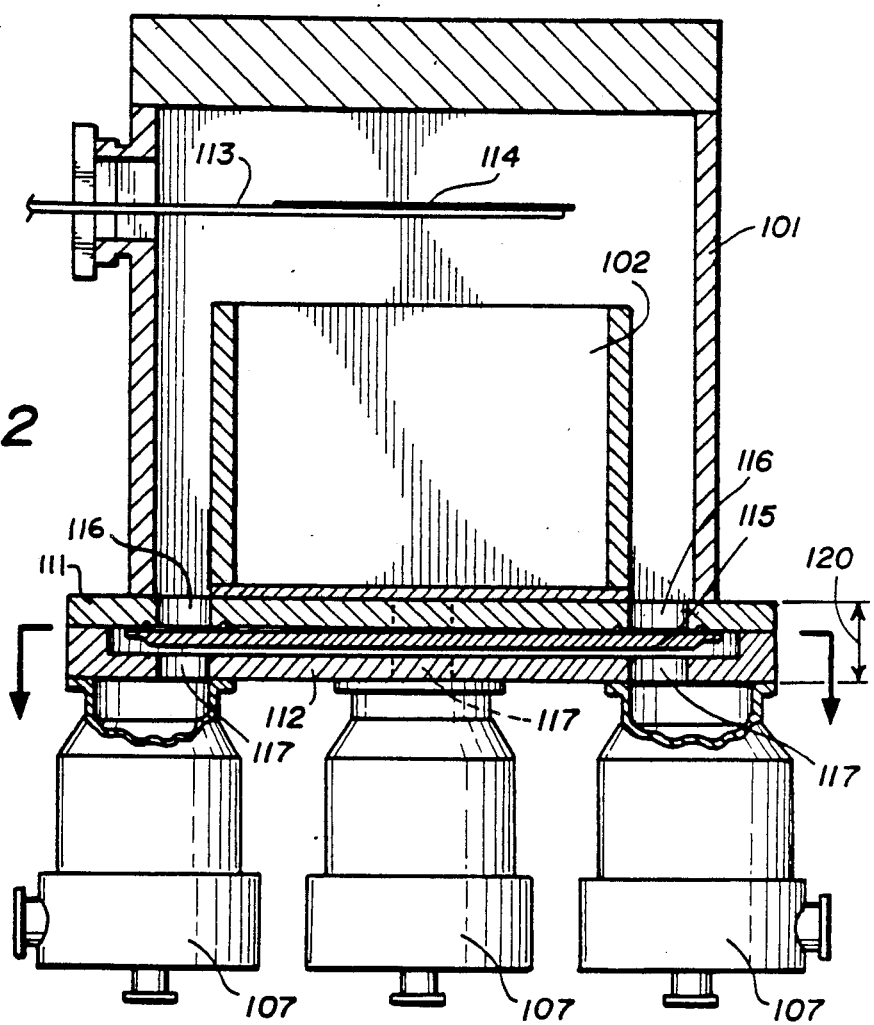
FIG. 2 shows a side view of a process chamber with four pumps and having a combination throttle/gate valve between the process chamber and the pumps in accordance with the preferred embodiment of the present invention.

FIG. 2 shows a side view of a process chamber 101 in accordance with the preferred embodiment of the present invention. Within process chamber 101 are an anode 102 and a wafer tray 113. On wafer tray 113 is shown a silicon wafer 114, which may typically be from four to eight inches in diameter.

Four turbo pumps 107 (three of which are shown in FIG. 2) are used to provide gas flow and low pressure within process chamber 101. A throttle/valve gate between process chamber 101 and pumps 107 is composed of a process chamber base plate 111 a lower plate 112 and a valve plate 115. A gate depth dimension 120 for the throttle/valve gate is between 1½ inches and 1¾ inches.

Figure 3:
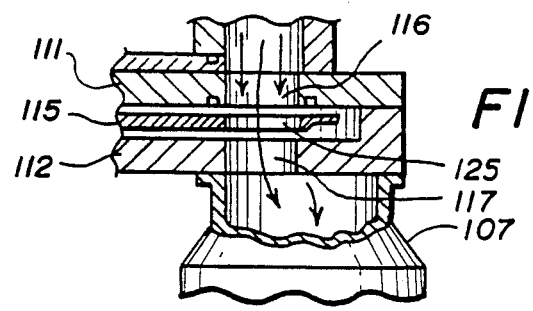
FIG. 3 shows gas flow from the process chamber, shown in FIG. 2, through the combination throttle/gate valve and into a pump in accordance with the preferred embodiment of the present invention.

FIG. 3 shows shows gas flow from process chamber 101 to a pump 107 when the throttle/valve gate is open. In the open position, holes 125 within valve gate 115 are lined up with holes 116 in chamber base plate 111 and holes 117 in lower plate 112. Air and gas flows from process chamber 101 through holes 116, through holes 125, through holes 117 to pumps 107.

Figure 4:
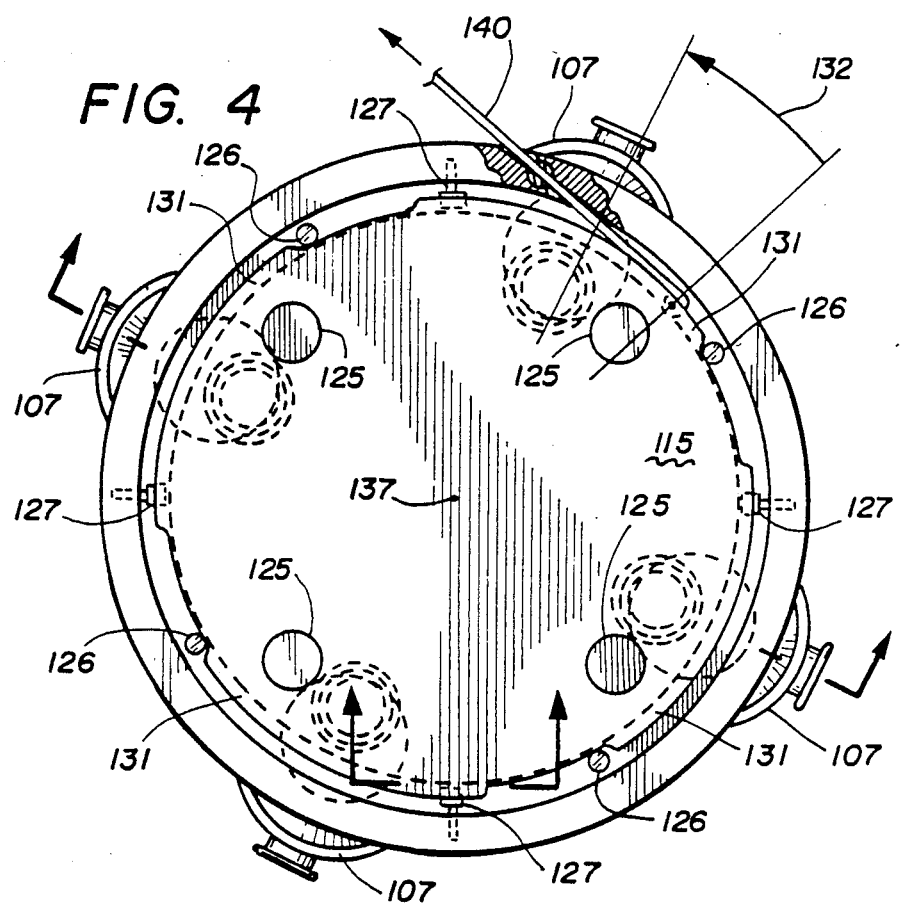
FIG. 4 shows a vertical view of the combination throttle/gate valve shown in FIG. 1 in accordance with the preferred embodiment of the present invention.

FIG. 4 shows a vertical view of the throttle/valve gate. Rotation of valve plate 115 around an axis 137 is limited by ridges 131 of valve plate 115 abutting cam followers 126. Reciprocal movement 132 of valve plate 115 around axis 137 is about fifteen degrees. Within this range of movement valve plate 115 may be completely opened, partially opened or completely closed, depending upon the amount of holes 125 overlap holes 116 and holes 117. A lever 140 is used to open and shut the throttle/valve gate.

Figures 5, 6:
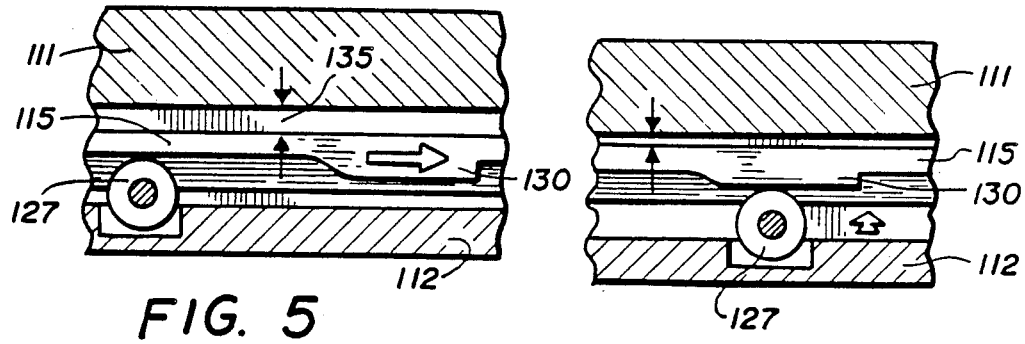
FIG. 5 shows how a valve plate is situated on cams when the combination throttle/valve gate shown in FIG. 1 is open in accordance with the preferred embodiment of the present invention.
FIG. 6 shows how the valve plate is situated on cams when the combination throttle/valve gate shown in FIG. 1 is closed in accordance with the preferred embodiment of the present invention.

Valve plate 115 rests on cams 127, mounted on lower plate 112. As may be seen in FIG. 5, when the throttle/valve gate is in the open position, a slight distance 135 exists between valve plate 115 and chamber base plate 111. This slight distance 135 allows valve plate 115 to rotate freely without friction from chamber base plate 111. As may be seen in FIG. 6, when the throttle/valve gate is in the closed position, vertical ridges 130 of valve plate 115 rest on cams 127 causing valve plate 115 to rest snugly against chamber base plate 111. This snug fit assures that when the throttle/valve gate is in the closed position, valve plate 115 completely seals off process chamber 101 from pumps 107.

The present invention, as shown in the above embodiment, allows for the efficient use of multiple turbo pumps to control gas flow and pressure within a process chamber. The preferred embodiment illustrates the use of four turbo pumps with a single process chamber. Depending on system requirements the number of turbo pumps per process chamber typically is between two and six.

I claim:

1. A combination gate valve and throttle valve for use between a process chamber and a plurality of pumps, the combination gate valve and throttle valve comprising:
   a base plate, coupled to the process chamber, the base plate having a plurality of base plate gas ports;
   a lower plate, the lower plate having a plurality of lower plate gas ports, each lower plate gas port aligning with a base plate gas port, wherein coupled to the lower plate at each lower plate gas port is a pump from the plurality of pumps;
   a gate plate, coupled between the base plate and the lower plate, the gate plate is being movable with respect to the base plate and the lower plate and the gate plate having a plurality of gate plate gas ports, so that when the gate plate is moved into an open position with respect to the base plate and the lower plate, the plurality of gate plate gas ports line up with the base plate gas ports and the lower plate gas ports allowing gas to pass from the process chamber to the plurality of pumps and so that when the gate plate is moved into a second position the process chamber is sealed off from the plurality of pumps.

2. A combination gate valve and throttle valve as in claim 1 additionally comprising:
   a plurality of cams attached to the lower plate, the gate plate resting on the plurality of cams.

3. A combination gate valve and throttle valve as in claim 2 wherein the gate plate includes a plurality of vertical ridges which rest on the plurality of cams when the gate plate is moved into the closed position resulting in the gate plate being elevated with respect to the base plate, the gate plate sealing gas from passing through the base plate gas ports to the pumps.

4. A combination gate valve and throttle valve is in claim 3 additionally comprising cam followers coupled to the lower plate, wherein the gate plate additionally comprises abutment ridges so that reciprocal movement of the gate plate is limited by the abutment ridges abutting against the cam followers.

5. A combination gate valve and throttle valve for use between a process chamber and at least one pump, the combination gate valve and throttle valve comprising:
   a base plate, coupled to the process chamber, the base plate having a plurality of base plate gas ports;
   a lower plate, the lower plate having a plurality of lower plate gas ports, each of the plurality of plate gas ports aligning with one of the plurality of base plate gas ports, and each of the at least one pump being coupled to the lower plate at one of the plurality of lower plate gas ports; and,
   a gate plate, coupled between the base plate and the lower plate, the gate plate being movable with respect to the base plate and the lower plate and the gate plate having a plurality of gate plate gas ports, so that when the gate plate is moved into an open position with respect to the base plate and the lower plate, the plurality of gate plate gas ports lines up with the plurality of base plate gas ports and the plurality of lower plate gas ports allowing gas to pass from the process chamber to the at least one pump, and so that when the gate plate is moved into a closed position the process chamber is sealed off from the at least one pump.

6. A combination gate valve and throttle valve as in claim 5 additionally comprising:
   a plurality of cams attached to the lower plate, the gate plate resting on the plurality of cams.

7. A combination gate valve and throttle valve as in claim 6 wherein the gate plate includes a plurality of vertical ridges which rest on the plurality of cams when the gate plate is moved into the closed position resulting in the gate plate being elevated with respect to the base plate, the gate plate sealing gas from passing through the plurality of base plate gas ports to the at least one pump.

8. A combination gate valve and throttle valve is in claim 7 additionally comprising cam followers coupled to the lower plate, wherein the gate plate additionally comprises abutment ridges so that reciprocal movement of the gate plate is limited by the abutment ridges abutting against the cam followers.

9. A method for providing a valve for gating and throttling gas flow from a process chamber to a plurality of pumps, the method comprising the steps of:
   (a) pumping gas from the process chamber to the plurality of pumps through at least one base plate gas port in a base plate coupled to the process chamber, through at least one gate plate gas port in a gate plate below the base plate and through at least one lower plate gas port in a lower plate below the gate plate; and,
   (b) rotating the gate plate with respect to the base plate and the lower plate in order to misalign the at least one gate plate gas port and the at least one base plate gas port so that gas flow from the process chamber to the plurality of pumps is cut off.

10. A method as in claim 9 wherein step (b) includes: elevating the gate plate with respect to the base plate so that a seal is formed by the gate plate over the at least one base plate gas port.

11. A method as in claim 9 wherein step (b) includes: limiting the reciprocal movement of the gate plate by abutting cam followers coupled to the lower plate with abutment ridges on the gate plate.

* * * * *